(12) United States Patent
Dufrene et al.

(10) Patent No.: US 8,803,720 B2
(45) Date of Patent: Aug. 12, 2014

(54) RF-DAC CELL AND METHOD FOR PROVIDING AN RF OUTPUT SIGNAL

(71) Applicant: Intel Mobile Communications GmbH, Neubiberg (DE)

(72) Inventors: Krzysztof Dufrene, Plesching (AT); Harald Pretl, Schwertberg (AT); Patrick Ossmann, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/711,958

(22) Filed: Dec. 12, 2012

(65) Prior Publication Data

US 2014/0159933 A1 Jun. 12, 2014

(51) Int. Cl.
 *H03M 1/66* (2006.01)
(52) U.S. Cl.
 USPC .......................................... 341/144; 341/147
(58) Field of Classification Search
 USPC .................... 341/144, 147; 455/173
 See application file for complete search history.

(56) References Cited

U.S. PATENT DOCUMENTS 7,273,370 B2 * 9/2007 Kohani ............................. 433/37
7,627,295 B2 * 12/2009 Takahiko et al. ............... 455/139
8,237,595 B2 * 8/2012 Petrovic ........................ 341/144
8,260,223 B2 * 9/2012 He ................................ 455/120
8,280,333 B2 * 10/2012 Van Sinderen et al. ....... 455/285

OTHER PUBLICATIONS

H. Darabi, H. Jensen, A. Zolfaghari, "Analysis and Design of Small-Signal Polar Transmitters for Cellular Applications," IEEE Journal of Solid-State Circuits, vol. 46, No. 6, pp. 1237-1249, Jun. 2011. 13 Pages.
D. Chowdhury, L. Ye, E. Alon, A. M. Niknejad, "An Efficient Mixed-Signal 2.4-GHz Polar Power Amplifier in 65-nm CMOS Technology," IEEE Journal of Solid-State Circuits, vol. 46, No. 8, pp. 1796-1809, Aug. 2011. 14 Pages.
R. Shrestha, E. Klumperink, E. Mensink, G. Wienk, B. Nauta , "A Polyphase Multipath Technique for Software-Defined Radio Transmitters," IEEE Journal of Solid-State Circuits, vol. 41, No. 12, pp. 2681-2692, Dec. 2006. 12 Pages.
N. Moseley, E. Klumperink, B. Nauta, "A Two-Stage Approach to Harmonic Rejection Mixing Using Blind Interference Cancellation," IEEE Trans. Circuits Syst. II, Exp. Briefs, vol. 55, No. 10, Oct. 2008. 5 Pages.
T. Yamaji, H. Tanimoto, J. Matsuno, T. Itakura, "Harmonic Signal Rejection Schemes of Polyphase Downconverters," IEEE Trans. Circuits Syst. I, Reg. Papers, vol. 58, No. 10, Oct. 2011. 10 Pages.
E. Klumperink, S. Louwsma, G. Wienk, B. Nauta , "A CMOS Switched Transconductor Mixer," IEEE Journal of Solid-State Circuits, vol. 39, No. 8, pp. 1231-1240, Aug. 2004. 10 Pages.

* cited by examiner

*Primary Examiner* — Brian Young
(74) *Attorney, Agent, or Firm* — Eschweiler & Associates, LLC

(57) ABSTRACT

An RF-DAC cell is configured to generate an RF output signal based on a baseband signal, a first signal and a second signal. The first signal has a first duty cycle and toggles between first predefined amplitude values, and the second signal has a second duty cycle smaller than the first duty cycle and toggles between second predefined amplitude values.

17 Claims, 9 Drawing Sheets

RF-DAC CELL AND METHOD FOR PROVIDING AN RF OUTPUT SIGNAL

FIELD

The present disclosure is directed to mobile communications, and more particularly is directed to an RF digital to analog converter (RF-DAC) that reduces undesired third order harmonics therein.

BACKGROUND

In various circuits it is required to convert an input signal being present in the digital domain into the analog domain for further processing. For example, in wireless transmitters baseband information signals are converted from the digital format to the analog format and are simultaneously upconverted using one or more RF digital-to-analog converters (RF-DAC) which are followed by one or more power amplifier circuits (PA circuits) for delivering the signals with the required power to an antenna. In such circuits, upconverting and amplifying the baseband information signal may result in the generation of harmonic signals, for example higher-order intermodulation distortion products which may result in a deterioration of the RF signal at the fundamental frequency.

SUMMARY

An RF-DAC cell is configured to generate an RF output signal based on a baseband signal, a first signal and a second signal, wherein the first signal has a first duty cycle and toggles between first predefined amplitude values and wherein the second signal has a second duty cycle smaller than the first duty cycle and toggles between second predefined amplitude values.

DETAILED DESCRIPTION

Figure 1:
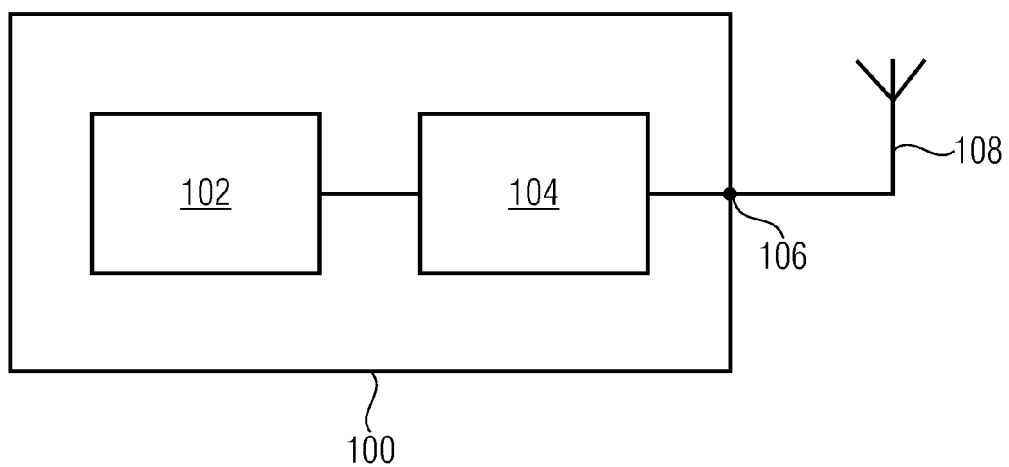
FIG. 1 shows a block diagram of an example mobile communication device.

FIG. 1 shows a block diagram of an example mobile communication device 100 comprising a digital baseband processor 102 and an RF front end 104 coupled to the baseband processor 102 and to an antenna port 106. The antenna port 106 is provided to allow connection of an antenna 108 to the mobile communication device 100. The baseband processor 102 generates signals to be transmitted via the antenna 108 which are forwarded to the RF front end 104 generating a transmit signal output to the antenna port 106 for transmission via the antenna 108. The RF front end 104 may also receive signals via the antenna port 106 from the antenna 108 and provides respective signals to the baseband processor 102 for processing the received signals. The apparatus and the method described in further detail in the following may be implemented in the baseband processor 102, for example in a processor operating on data signals for generating the respective input signals to the RF front end 104, and/or in the RF front end 104, like in a polar transmitter used for generating the transmit signal output at antenna port 106 on the basis of inputs signals received from the baseband processor.

In one embodiment the mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

Figure 2:
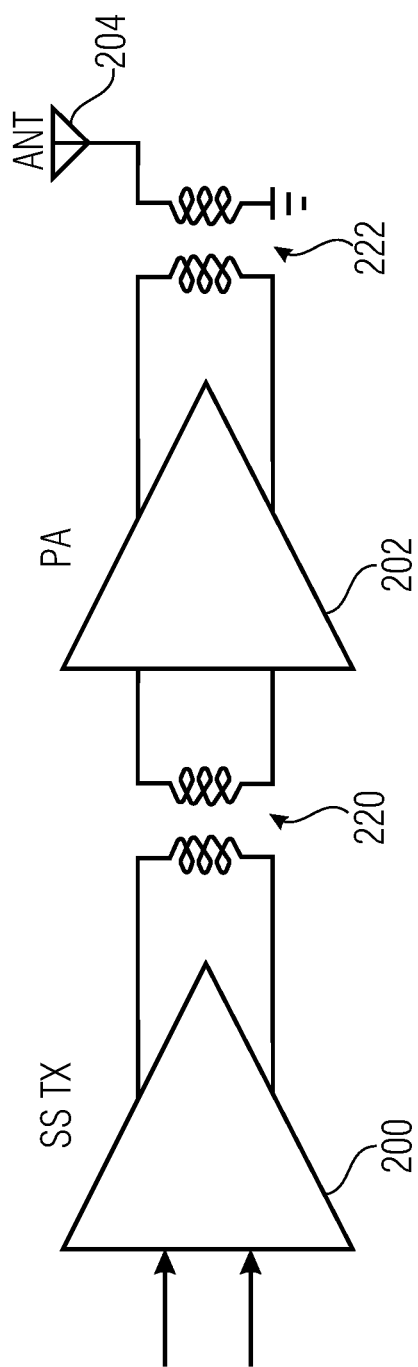
FIG. 2 shows a general block diagram of a circuit including a small signal RF-DAC (RF Digital-to-Analog-Converter) followed by a separate power amplifier.

FIG. 2 shows a block diagram of a small signal transmitter (TX) 200 followed by a power amplifier 202. The circuit illustrated in FIG. 2 shows the small signal TX block 200 and the PA block 202 as being magnetically coupled by means of a transformer 220. The transformer 220 converts the differential output of the small signal TX to a single-ended output in case of RF circuits (front-end modules) incorporating an external power amplifier, and decouples the DC common-mode potential at the small signal TX output from the DC common-mode potential at the power amplifier input, for example, in case of transceivers having integrated differential power amplifiers. Additionally, the transformer 220 filters out upconverted baseband signals at higher LO harmonics which may be quite significant, for example, in case of using square-wave like LO signals utilized for a fast, low-noise and low-distortion switching. The output signal present at the output of the power amplifier 202 may be coupled via a further transformer 222 to an antenna 204.

Figure 3:
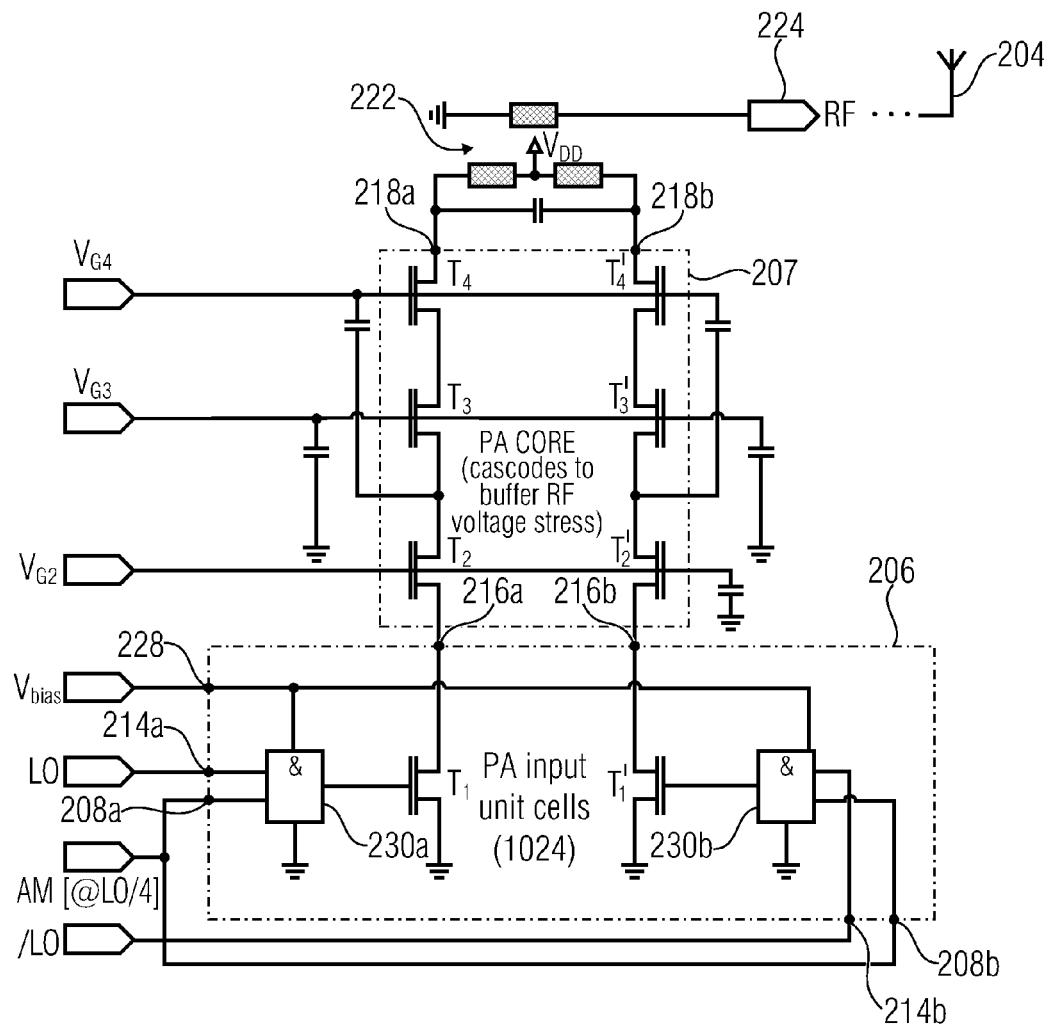
FIG. 3 shows a circuit including an RF-DAC and a power amplifier which are merged into one block.

FIG. 3 shows a circuit including an RF-DAC and a power amplifier which are merged into one block so that the circuit shown in FIG. 3 may be called a power DAC (PWR-DAC). The circuit comprises an RF-DAC 206 and a cascode buffering stage 207 that may be coupled to an antenna 204. The signals for controlling the RF-DAC cell 206 may be provided based on the signals from a baseband processor which may operate in the polar domain, thereby providing as output the amplitude component and the phase component of the baseband signal. The amplitude component forms a control signal for the respective RF-DAC cells 206 of which in FIG. 3 a plurality of such cells may be provided, for example 1024. However, for clarity reasons, only a single cell 206 is depicted in FIG. 3. Further, the phase component provided by the baseband processor to a local oscillator source is provided for generating the local oscillator signals LO, /LO supplied to the RF-DAC cell 206.

In this example, the first local oscillator signal LO and the second local oscillator signal /LO are shifted by substantially half of a LO period, which may also be referred to as "complementary".

In the circuit of FIG. 3, the RF-DAC cell 206 includes the control inputs 208a and 208b receiving the amplitude signal from the baseband processor as well as the control inputs 214a and 214b for receiving the two LO signals LO, /LO. Further, the RF-DAC cell 206 includes a bias input 228 for receiving a bias signal. The RF-DAC cell 206 includes a first logic block 230a and a second logic circuit 230b, for example AND-Gates. The AND-Gate 230a receives the signal from inputs 208a and 214a and generates an output signal for controlling a transistor $T_1$ coupled between a reference potential and the first output 216a of the RF-DAC cell 206. Likewise, the AND-Gate 230b receives the signals from the inputs 208a and 214b and generates a control signal for controlling transistor $T_1'$ coupled between the second output 216b and the reference potential. The AND-Gates 230a and 230b further receive the bias signal $V_{BIAS}$ from the bias input 228.

The cascode buffering stage 207 comprises three stages, each stage comprising a pair of transistors, for example field effect transistors. The cascode buffering stage 207 may comprise in a first stage the two transistors $T_2$ and $T_2'$, in a second stage the transistors $T_3$ and $T_3'$, and in a third stage the transistors $T_4$ and $T_4'$. The first transistors $T_2$ to $T_4$ of the three stages are connected in series between the first output 216a of the RF-DAC cell 206 and a first output 218a of the cascode buffering stage 207, and the second transistors $T_2'$ to $T_4'$ of the three stages are connected in series between the second output 216b of the RF-DAC cell 206 and a second output 218b of the cascode buffering stage 207. The respective stages receive control signals $V_{G2}$ to $V_{G4}$ for activating/deactivating or selecting the respective stages so that a signal applied to the cascode buffering stage 207 is amplified by one or more of the stages for providing a respectively amplified signal at the outputs 218a and 218b. The cascode buffering stage 207 provides at its outputs 218a and 218b a differential RF output signal. The differential output signal present at the outputs 218a and 218b of the cascode buffering stage 207 is coupled via a transformer 222 to an RF output terminal 224 which may be coupled to the antenna 204. The circuit shown in FIG. 3 may, for example, be used in a further step of transmitter integration in which the RF-DAC circuit and the PA circuit are merged into the above referenced one block, the power-DAC block.

The circuit shown in FIG. 3 may, for example, be used in a further step of transmitter integration in which the RF-DAC circuit and the PA circuit are merged into the above referenced one block, the power-DAC block. One significant difference of the architecture of FIG. 3, when compared to the architecture of FIG. 2, is the lack of the interstage transformer shown at 220 in FIG. 2. The power DAC architecture shown in FIG. 3 will yield higher harmonic emissions. The output transformer 222 and the antenna matching filter (not shown in FIG. 2) may filter higher LO harmonics to some extent, however, the total attenuation is worse when compared to the case of using cascaded transformers 220, 222 as shown in FIG. 2. Further, the RF current flowing from the transconductor unit array (the plurality of power amplifier input unit cells 206 shown in FIG. 3) to the voltage-buffering cascode circuit 207 has strong harmonic content. At high output powers, the cascode buffering stage 207 behaves in a very nonlinear way, for example, the respective transistors of the cascode toggle between the saturation region and the triode region, so that when the signal enters the cascode buffering stage 207 a third order harmonic H3 will intermodulate with the fundamental H1, thereby generating a third order intermodulation distortion product IMD3 which will be located at the fundamental frequency, thereby deteriorating the quality of the synthesized RF signal (e.g. an increased EVM—Error Vector Magnitude) output by the circuit.

Figure 4:
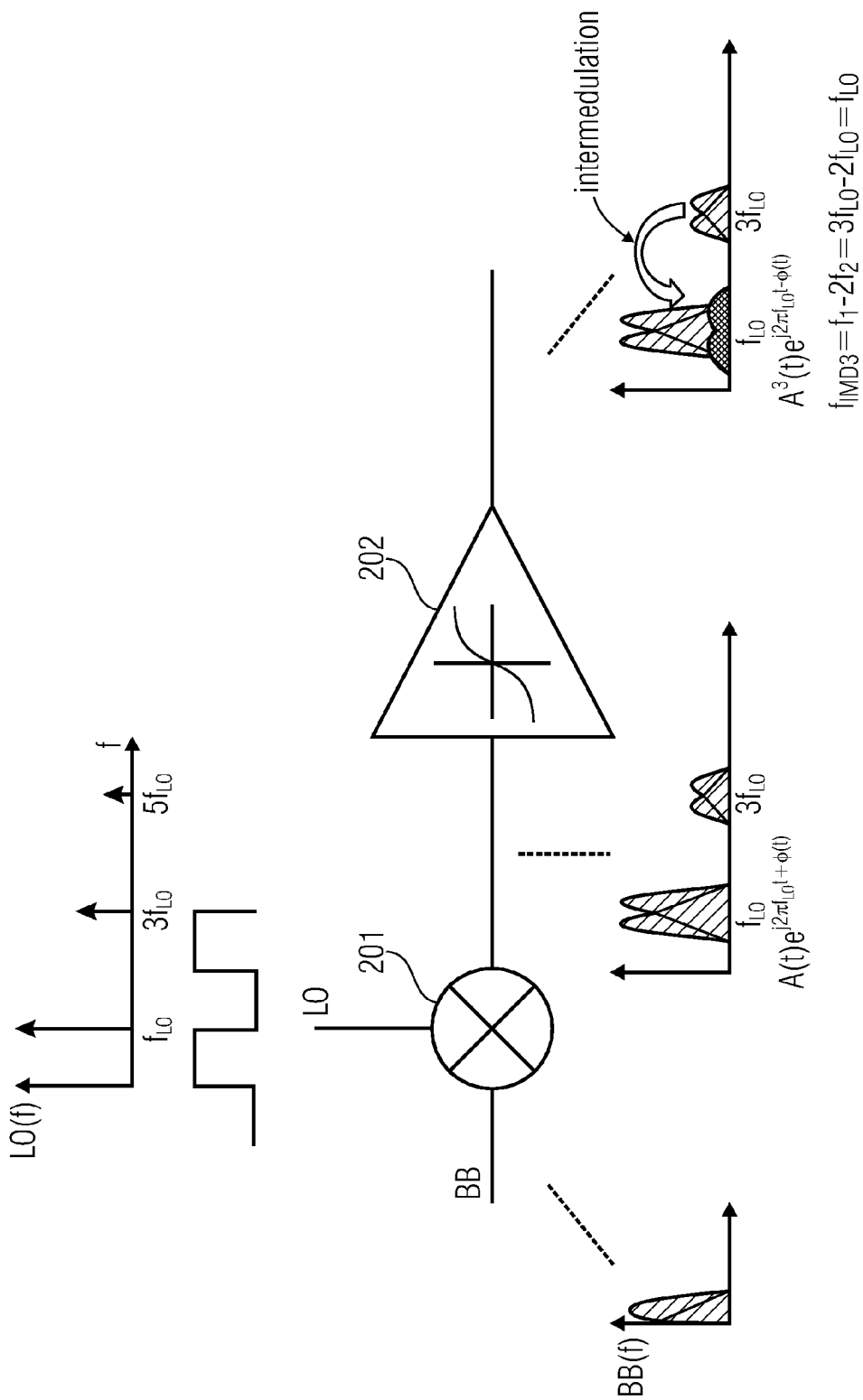
FIG. 4 illustrates the H1, H3 nonlinear interaction resulting in a third order intermodulation distortion product.

FIG. 4 illustrates the above mentioned H1, H3 nonlinear interaction resulting in the third order intermodulation distortion product. In FIG. 4, the RF-DAC is schematically shown at 201 as a mixer circuit receiving at a first input the LO signal and at a second input the baseband signal BB. The baseband signal is shown in FIG. 4 at the left-hand side on the bottom and the LO signal is a square-shaped signal as shown in the upper portion. Also, the fundamental frequency $f_{LO}$ of the LO signal is shown as well as the third order and fifth order harmonics of the LO signal. As can be seen from FIG. 4, mixing the baseband signal BB and the LO signal by means of the mixer 201 results in an input signal to be provided to the power amplifier 202 having a component both at the fundamental frequency or $f_{LO}$ and also at the third order harmonics $3f_{LO}$ as shown in the center diagram at the lower part of FIG. 4. Due to the above mentioned nonlinear behavior of the power amplifier 202 at high output powers, the third order harmonic may be intermodulated with the fundamental frequency so that the frequency of the third order intermodulation distortion product $f_{IMD3}$ to equal to the fundamental frequency of the local oscillator signal, i.e., the third order harmonic is shifted to the fundamental frequency $f_{LO}$, thereby deteriorating the quality of the output signal provided by the power amplifier 202.

In the following, examples of an apparatus and a method will be described, addressing the above mentioned problem regarding the deterioration of the output signal of the power amplifier due to the intermodulation of the third order harmonic and the fundamental frequency of the LO signal as discussed above with regard to FIG. 4.

Figure 5:
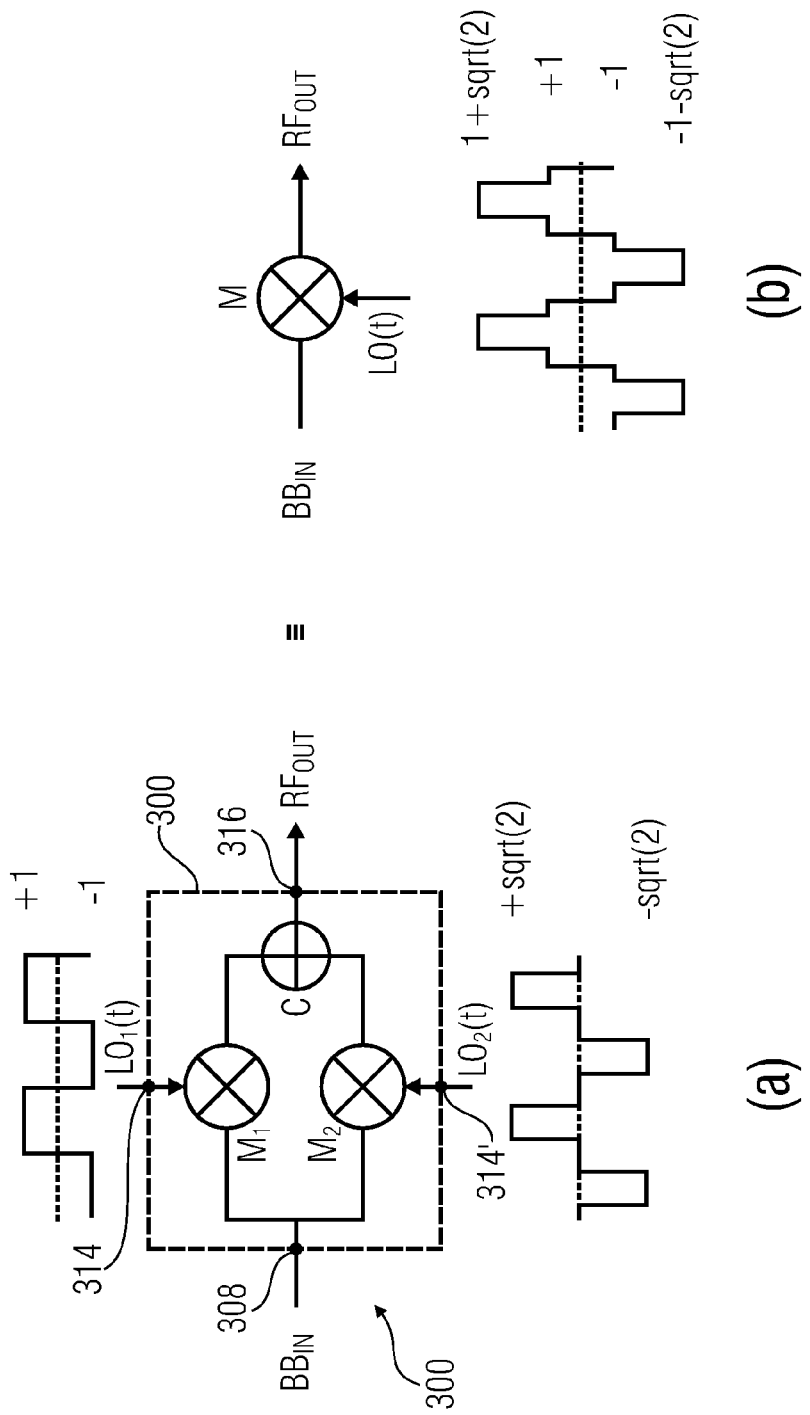
FIGS. 5A-5B are schematic representations of a circuit arrangement for implementing third order harmonic rejection/suppression in an RF-DAC unit cell circuit.

The above described undesired effect may be reduced or eliminated by providing an RF-DAC unit cell circuit arrangement allowing third order harmonic rejection. By implementing the technique in each of the unit cells of a given power-DAC circuit, the entire circuit including the power amplifier can be improved for achieving better performance. FIGS. 5A and 5B are schematic representations of a circuit arrangement for implementing third order harmonic rejection in an RF-DAC unit cell circuit. FIG. 5A shows a first representation of an RF-DAC cell 300. In FIG. 5A, a non-differential cell 300 is shown illustrating the basic structure that may be used in the following described examples. The cell 300 includes an input 308 receiving the baseband signal $BB_{IN}$, for example, the amplitude signal, and further control inputs 314 and 314' for receiving two LO signals $LO_1(t)$ and $LO_2(t)$. The cell 300 further comprises two mixers $M_1$ and $M_2$ and a combiner C. The baseband signal $BB_{IN}$ is mixed in the first mixer $M_1$ with the first LO signal $LO_1(t)$ and in the second mixer $M_2$ with the second LO signal $LO_2(t)$. The output signals from the two mixers $M_1$ and $M_2$ are supplied to the combiner C outputting, at the output 316, the RF output signal $RF_{OUT}$. The approach described in the following examples is to multiply the baseband input signal $BB_{IN}$ received at the input 308 of the cell 300 by the polyphase LO signals $LO_1(t)$ and $LO_2(t)$ such that the combined signal at the output 316 has substantially no or at least a substantially reduced third order harmonic. This is achieved by providing a first LO signal $LO_1(t)$ having a first duty cycle and toggling between first predefined amplitude values and providing a second LO signal $LO_2(t)$ having a second duty cycle which is smaller than the first duty cycle and which toggles between second predefined amplitude values which are higher than the first predefined amplitude values. In the example shown in FIG. 5A the first LO signal $LO_1(t)$ is a square wave signal, as is depicted in the upper part of FIG. 5A toggling between the amplitude values +1 and −1 and having a 50% duty cycle. The second LO signal $LO_2(t)$ in the example of FIG. 5A, as can be seen from the signal in the lower part of FIG. 5A, has a second duty cycle, is shifted by 45° with regard to the first LO signal $LO_1(t)$ and toggles between the values $+\sqrt{2}$ and $-\sqrt{2}$ with a duty cycle of 25%. FIG. 5B show a single mixer M receiving the baseband input signal $BB_{IN}$ and the combined LO signal LO(t) being a combination of the LO signals $LO_1(t)$ and $LO_2(t)$ of FIG. 5(a).

In other examples, the first and second LO signals may have a different signal shape, e.g. a sinusoidal shape. The LO signals may toggle between first and second amplitudes having different absolute values. Also, the first LO signal may toggle between a logical high value and a logical low value, and the second LO signal may toggle between a multiple of the logical high value and the logical low value.

The example described above with regard to FIGS. 5A and 5B may be applied to RF-DACs, e.g. power DACs, supporting the modulation of input signals either in the polar domain or in the Cartesian (IQ) domain using the main LO signal $LO_1(t)$ and the auxiliary LO signal $LO_2(t)$ in a way as described above. In the polar domain, the auxiliary phase shifted LO signal $LO_2(t)$ has the same phase modulation as the main LO signal. In the Cartesian domain, the auxiliary LO waveforms are generated for both the in-phase and the quadrature LO signals.

The approach described above with regard to the example of FIGS. 5A and 5B is advantageous as it yields a better, namely lower, EVM of the transmitted signal due to the reduced H1-H3 nonlinear interaction and, in addition, the emissions of harmonics are reduced. By applying the approach described with regard to FIGS. 5A and 5B in all of the RF-DAC unit cells it is possible to generate RF signals having reduced third order harmonic content so that the overall circuit can achieve a better EVM and reduced harmonic emissions when compared to the examples described with regard to FIGS. 2 and 3, irrespective of the output power level, even up to the maximum specified output power.

In the following, examples for implementing the approach described with regard to FIGS. 5A and 5B will be described in further detail.

Figure 6:
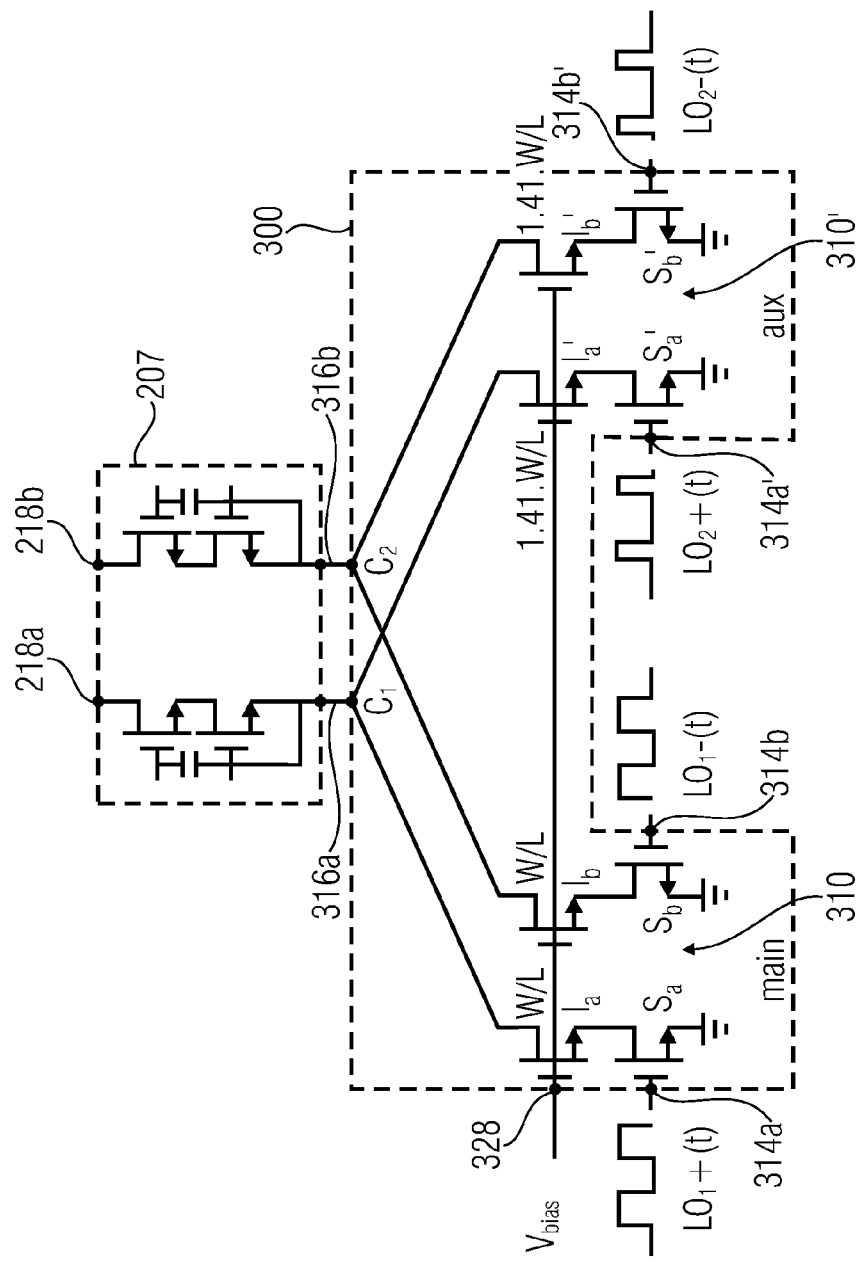
FIG. 6 shows an example of an RF-DAC harmonic-rejection unit cell for a power DAC circuit like the one shown in FIG. 3.

FIG. 6 shows an example of an RF-DAC harmonic-rejection unit cell 300. In FIG. 6, again, for clarity reasons, only a single cell 300 is depicted. However, in other implementations it may be desired to provide a plurality of such cells, for example 1024 cells, as has also been mentioned above with regard to FIG. 3. FIG. 6 shows the architecture including the single cell 300 coupled to the cascode buffering stage 207 which may have the same structure as the power amplifier described with regard to FIG. 3.

The cell 300 includes a main part "MAIN" and an auxiliary part "AUX". The main part includes two current sources $I_a$ and $I_b$ which, in the example depicted in FIG. 6, are formed by field effect transistors controlled by the bias signal received at input 328. In the example shown in FIG. 6, the two field effect transistors forming the current sources $I_a$ and $I_b$ have the same ratio W/L (channel width/channel length), thereby providing, when being activated by the control signal 328, the same currents at their outputs. The main part further includes two switches $S_a$ and $S_b$, which, in the example shown in FIG. 6, are also formed by field effect transistors controlled by the two control signals received at control inputs 314a and 314b. More specifically, the switch $S_a$ is controlled by the first LO signal $LO_{1+}(t)$ and the second switch $S_b$ is controlled by a second LO signal $LO_{1-}(t)$, wherein the second LO signal $LO_{1-}(t)$ is a signal shifted in time by substantially half of an LO period when compared to the first LO signal $LO_{1+}(t)$. The first switch $S_a$ is connected between the first current source $I_a$ and a reference potential and the second switch $S_b$ is connected between the second current source $I_b$ and the reference potential, for example, ground. The first current source $I_a$ is connected between a first combiner $C_1$ and the switch $S_a$, and the second current source $I_b$ is connected between a second combiner $C_2$ and the second switch $S_b$. The combiners $C_1$ and $C_2$ are connected to the first and second outputs 316a and 316b of the cell 300.

The auxiliary part of the example architecture shown in FIG. 6 has basically the same structure as the main part except that the switches $S_a'$ and $S_b'$ are controlled by the first and second auxiliary LO signals $LO_{2+}(t)$, $LO_{2-}(t)$. Further, the current sources $I_a'$ and $I_b'$ provide a higher current when being activated, e.g. a current being 1.41 times the current provided by the current sources $I_a$ and $I_b$ of the main part. This may be achieved by providing the auxiliary current sources $I_a'$ and $I_b'$ by field effect transistors which correspond to the field effect transistor of the main current sources except for a different ratio of the channel width to the channel length which is 1.41 times the ratio of the MOSFETS used in the main part (see also the labels in FIG. 6) in this embodiment. In the auxiliary part, the first auxiliary current source $I_a'$ is connected between the first combiner $C_1$ and the first auxiliary switch $S_a'$ which, in turn, is connected to the reference potential and receives its control signal from the input 314a' at which the first auxiliary LO signal $LO_{2+}(t)$ is applied. The second auxiliary current source $I_b'$ is connected between the second combiner $C_2$ and the second auxiliary switch $S_b'$ which, in turn, is connected to the reference potential and receives at its control gate from the control input 314b' the second auxiliary LO signal $LO_{2-}(t)$.

The combiners $C_1$ and $C_2$ combine the signals from the main and auxiliary parts of the cell 100, more specifically, combiner $C_1$ combines the signals provided by the first current sources $I_a$ and $I_a'$ from the main and auxiliary parts, wherein the combiner $C_2$ combines the signals from the second current sources $I_b$ and $I_b'$ from the main and auxiliary parts, and provide the combined signals at the outputs 316a and 316b to the cascode buffering stage 207.

The architecture described in FIG. 6 is based on a switched transconductor concept in which the LO switches $S_a$, $S_a'$, $S_b$, $S_b'$ are placed below the current sources $I_a$, $I_a'$, $I_b$, $I_b'$. This architecture is advantageous for being implemented using ultra-deep submicron technologies which allows fast switching devices to be implemented as low-voltage transistors and to be better protected from large output voltage swings, thereby ensuring a longer life time.

Figure 7:
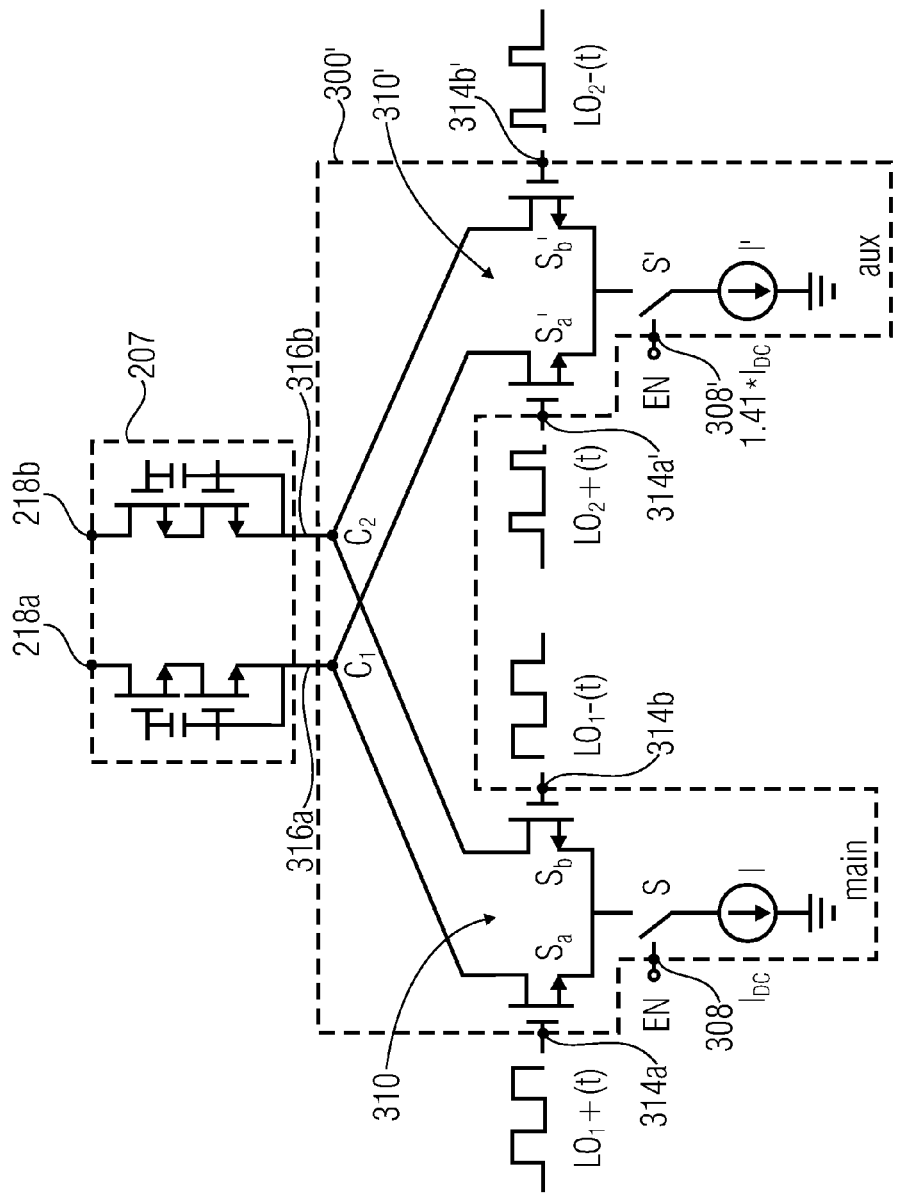
FIG. 7 shows another example of a harmonic rejection unit cell for an RF-DAC circuit.

FIG. 7 shows another example for a harmonic rejection unit cell 300'. Elements already described with regard to FIG. 6 have associated the same reference signs and will not be described again.

When compared to FIG. 6, the architecture of FIG. 7 makes use of an RF-DAC similar to the one described with regard to FIG. 2. Other than in FIG. 6, in the architecture of FIG. 7, the switches $S_a$, $S_a'$, $S_b$, $S_b'$ of the main and auxiliary parts of the cell 300 are coupled between the combiners $C_1$ and $C_2$ and the current sources. In the architecture of FIG. 7, the main part includes a single current source I providing the current IDC and coupled to the two switches $S_a$ and $S_b$ via a further switch S being controlled based on a digital control signal EN provided at an input 308. In a similar way, the auxiliary part includes a single current source I' providing a current being 1.41 times the current of the current source I in the main part, as indicated by the labels in FIG. 7. By means of a switch S' controlled by the control signal EN applied at the control input 308', the current source is selectively coupled to the switches of the auxiliary part. By means of the switches $S_a$ and $S_b$, in the main part, a mixer cell 310, is formed and, likewise, by means of the switches $S_a'$ and $S_b'$ in the auxiliary part, an auxiliary mixer cell 310' is formed.

In FIG. 7, as in the other figures, the current sources I and I' may be provided by respective current sources having aspect ratios scaled by approximately 1.41 with respect to one another. Both current sources I and I' are activated by the enable digital control signal EN. The output current of the first current source I is fed to the up converting mixer 310 formed by the switches $S_a$ and $S_b$ and controlled by the 50% duty cycle LO signal. The output current of the larger second current source I' is fed to the second upconverting mixer 310' formed by the switches $S_a'$ and $S_b'$ and controlled by the 25% duty cycle LO signal. The upconverted differential signals are combined at the combiners $C_1$ and $C_2$ and fed to the cascode buffering stage 207.

Figure 8:
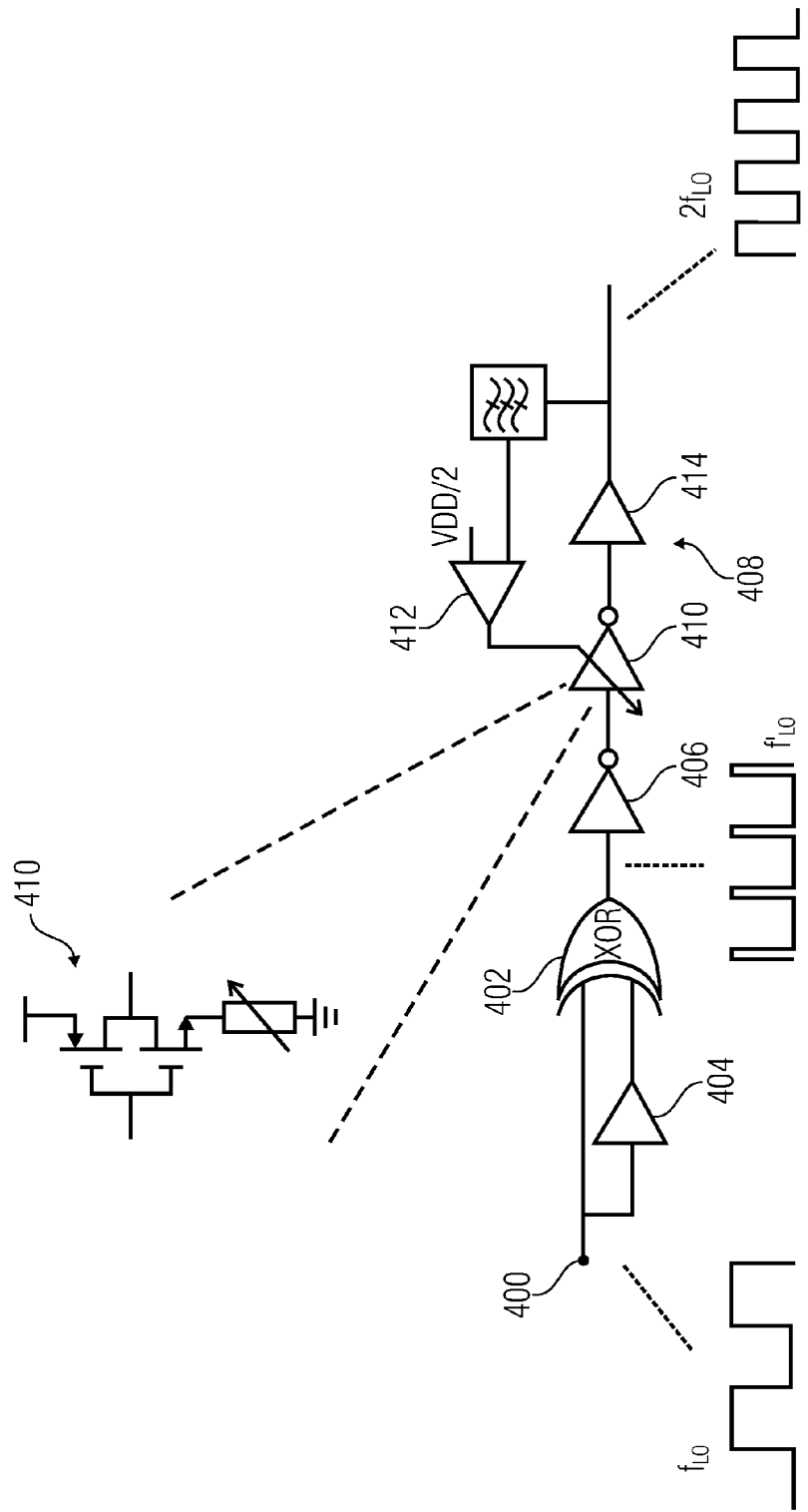
FIG. 8 shows an example of a frequency doubler circuit.

For implementing the above described harmonic rejection RF-DAC circuits, a plurality of LO signals is required, for example the generation of eight phase LO signals both for the low-band frequencies used in a transmitter and for the high-band frequencies used in the transmitter. When the transmitter comprises a phase locked loop in which the voltage or digitally controlled oscillators run at four-times the low-band transmit frequencies, the generation of eight phase LO signals in the low bands can be achieved easily using a simple digital logic circuit. For the high-band LO frequencies, it will be necessary to double the VCO or DCO frequency using a suitable frequency doubler. FIG. 8 shows an example for such a frequency doubler. At an input 400 the frequency doubler circuit receives the LO signal, as it is depicted, for example, in the left-hand part of FIG. 8. The circuit comprises an XOR Gate 402 receiving the LO signal at a first input and a delayed version of the LO signal at a second input. The delayed version of the LO signal is generated by applying the LO signal from the input 400 via a delay element 404 to a second input of the XOR gate 402. The wave form $f_{LO}'$ output at the XOR Gate 402 is depicted in the center part of FIG. 8 and is applied via an inverter 406 to a signal shaper 408 for restoring the 50% duty cycle of the signal again. In the example of FIG. 8, the signal shaper is based on a simple delay locked loop including an amplifier 410 having a structure as, for example, shown in the upper part of FIG. 8 which is controlled by a control signal output from the comparator 412 comparing the delayed and low pass filtered output signal from the amplifier 410 with a reference voltage $V_{DD}/2$. The output of the amplifier 410 delayed by the delay element 414 is shown at the right-hand part of FIG. 8 as $2f_{LO}$.

Figure 9:
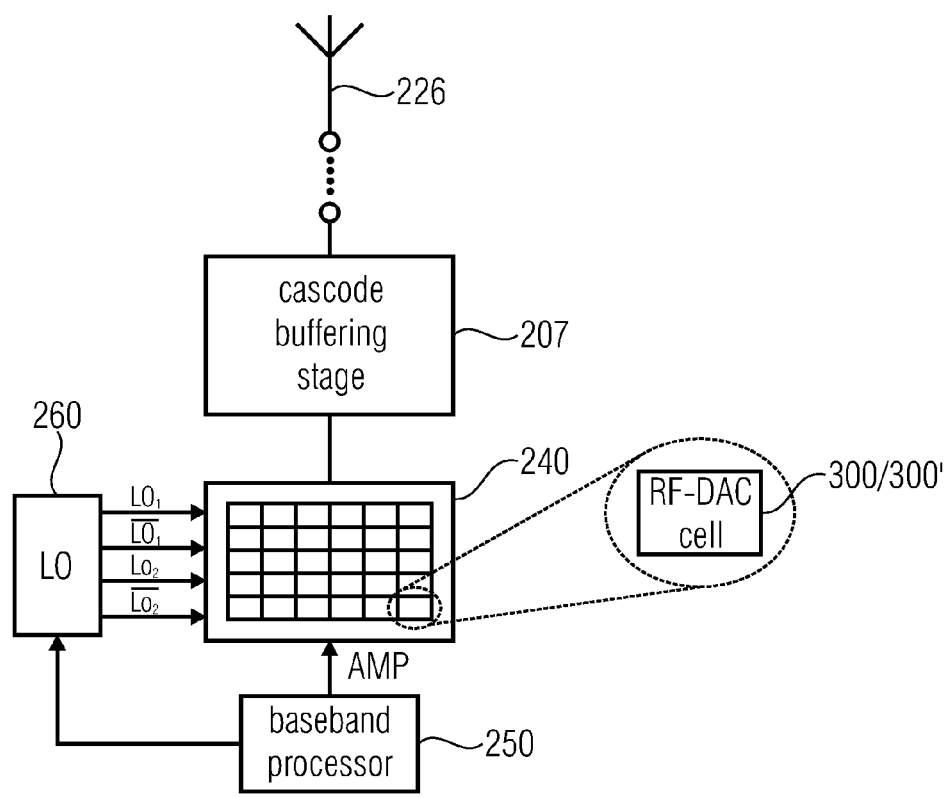
FIG. 9 shows a schematic representation of an arrangement including a plurality of RF-DAC cells having an architecture as described above with regard to FIGS. 5 to 7.

In the above description, only a single RF-DAC cell 300, 300' has been described. As has been mentioned above, a plurality of such RF-DACs may be provided, for example, 1024 of such elements may be provided. FIG. 9 shows a schematic representation of an arrangement including a plurality of RF-DAC cells 300, 300' having an architecture as described above with regard to FIGS. 5A to 7. The circuit architecture shown in FIG. 9 includes the cascode buffering stage 207 and a matrix 240 including a plurality of RF-DAC cells 300, 300'. The matrix 240 includes suitable decoder circuitry for selecting one or more RF-DAC cells. Further, a baseband processor 250 is shown operating in the digital domain and providing the baseband signal in the polar domain, in the example shown in FIG. 9, and providing the amplitude signal to the matrix 240 and the phase signal to a LO circuit 260 which generates the respective LO signals for the main and auxiliary parts as described above in further detail. The above architecture may also be used for baseband processors operating in the IQ domain.

The above examples have been described on the basis of LO signals, the main and auxiliary LO signals, having different amplitude values, e.g. the auxiliary LO signal has an amplitude value greater than the auxiliary LO signal. In accordance with alternative examples, the amplitude values for the main and auxiliary LO signals may be substantially equal. For example, the above mentioned main and aux paths may provide the same amplitude with just different duty cycles. While an approximation of the sine wave may poorer in that case (when compared to a case with an amplitude ratio of about 1.41), it may be still satisfactory for some application.

Although some examples have been described in the context of an apparatus, it is clear that these examples also represent a description of the corresponding method, where a block or device corresponds to a method step or a feature of a method step. Analogously, examples described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A radio frequency digital to analog converter (RF-DAC) cell,
    wherein the RF-DAC cell is configured to generate an RF output signal based on a baseband signal, a first signal and a second signal, and
    wherein the first signal has a first duty cycle and toggles between first predefined amplitude values and the second signal has a second duty cycle smaller than the first duty cycle and toggles between second, predefined amplitude values, and
    wherein the second predefined amplitude values are less than or are greater than the first predefined amplitude values.

2. The RF-DAC cell of claim 1, comprising:
    a first up-converting mixer configured to mix the baseband signal and the first signal;
    a second up-converting mixer configured to mix the baseband signal and the second signal; and
    a combiner configured to combine the output signals from the first and second up-converting mixers, respectively, into the RF output signal.

3. The RF-DAC cell of claim 1, further configured to generate a further RF output signal based on the baseband signal, a third signal and a fourth signal, the further RF output signal being shifted by substantially half of a local oscillator (LO) signal period with respect to the RF output signal,
    wherein the first and third signals are signals shifted by substantially half of the LO period, and wherein the second and fourth signals are signals shifted by substantially half of the LO period.

4. The RF-DAC cell of claim 1, comprising:
    a first current source configured to provide a first current;
    a second current source configured to provide a second current;

a first switch configured to receive a first LO-signal having the first duty cycle and toggling between a first high level and a first low level;
a second switch configured to receive a second LO-signal having the second duty cycle and toggling between a second high level and a second low level; and
a combiner configured to combine the first and second currents from the first and second current sources, respectively,
wherein the first and second switches are configured to cause, when activated, the first and second current sources to output the first and second currents, respectively, to the combiner.

5. The RF-DAC cell of claim 4, wherein the first and second currents are the same, or wherein the second current is less than or is greater than the first current.

6. The RF-DAC cell of claim 4, further comprising:
a third current source configured to provide the first current;
a fourth current source configured to provide the second current;
a third switch configured to receive a third LO signal being shifted by substantially half of the LO period of the first LO signal;
a fourth switch configured to receive a fourth LO signal being shifted by substantially half of the LO period of the second LO signal; and
a further combiner configured to combine the first and second currents from the third and fourth second current sources, respectively,
wherein the third and fourth switches are configured to cause, when activated, the third and fourth current sources to output the first and second currents, respectively, to the further combiner.

7. The RF-DAC cell of claim 4, wherein the first and second current sources comprise respective field effect transistors having different aspect ratios selected to provide the first and second currents.

8. The RF-DAC cell of claim 4, wherein:
the combiner is connected to an output,
the first current source is connected between the combiner and the first switch,
the first switch is connected between the first current source and a reference potential,
the second current source is connected between the combiner and the second switch, and
the second switch is connected between the second current source and the reference potential.

9. The RF-DAC cell of claim 4, wherein:
the combiner is connected to an output,
the first switch is connected between the combiner and the first current source,
the first current source is connected between the first switch and the reference potential,
the second switch is connected between the combiner and the second current source, and
the second current source is connected between the second switch and the reference potential.

10. The RF-DAC cell of claim 1, further comprising a power amplifier stage configured to amplify the RF output signal.

11. A radio frequency digital to analog converter (RF-DAC) cell,
wherein the RF-DAC cell is configured to generate an RF output signal based on a baseband signal, a first signal and a second signal, and
wherein the first signal has a first duty cycle and toggles between first predefined amplitude values and the second signal has a second duty cycle smaller than the first duty cycle and toggles between second, predefined amplitude values; and
a power amplifier stage configured to amplify the RF output signal,
wherein the power amplifier stage and the RF-DAC cell is integrated into a common circuit, and wherein an input of the power amplifier stage is connected to the output of the RF-DAC cell without a transformer provided therebetween.

12. The amplifier circuit of claim 10, wherein the power amplifier stage and the one or more RF-DAC cells are magnetically coupled by a transformer.

13. The RF-DAC cell of claim 1, wherein:
the first duty cycle is about 50%,
the second duty cycle is about 25%, and
the second predefined values are about $\sqrt{2}$ times the first predefined values.

14. An RF-DAC cell, comprising:
a first output configured to output a first RF output signal;
a second output configured to output a second RF output signal shifted by substantially half of a LO period with respect to the first RF output signal;
a main cell including:
a first current source and a second current source configured to be activated in response to a digital control signal derived from a digital baseband signal, and to provide, when activated, a first current; and
a first switch and a second switch connected between the first current source and second current source, respectively, and ground, and configured to be activated in response to a first LO signal and a second LO signal being shifted by substantially half of a LO period of the first LO signal, respectively, and to cause, when activated, the first and second current sources to output the first current to the first and second outputs, respectively; and
an auxiliary cell including:
a third current source and a fourth current source configured to be activated by the digital control signal, and to provide, when activated, a second current; and
a third switch and a fourth switch connected between the third current source and fourth current source, respectively, and ground, and configured to be activated by a third LO signal and a fourth LO signal being shifted by substantially half of a LO period of the third LO signal, the third and fourth LO signals having a duty cycle smaller than the first and second LO signals and to cause, when activated, the third and fourth current sources to output the second current to the first and second outputs, respectively,
wherein the first and second outputs are configured to combine the first and second currents from the first current source and the third current source and from the second current source and the fourth current source, respectively, into the first RF output signal and into the second RF output signal.

15. The RF-DAC cell of claim 14, wherein the first and second currents are the same, or wherein the second current is less than or is greater than the first current.

16. A method for producing an RF output signal, the method comprising:
generating an RF output signal based on a baseband signal, a first signal and a second signal, wherein the first signal has first duty cycle and toggles between first predefined amplitude values, wherein the second signal has a second duty cycle smaller than the first duty cycle and toggles between second predefined amplitude values, and wherein the second predefined amplitude values are less than or are greater than the first predefined amplitude values.

17. The method of claim 16, wherein generating the RF output signal comprises:

mixing the baseband signal and the first signal for obtaining a first up-converted signal;

mixing the baseband signal and the second signal for obtaining a second up-converted signal; and combining the first and second up-converted signals into the RF output signal.

* * * * *